US007155355B2

(12) United States Patent
Pickerd

(10) Patent No.: US 7,155,355 B2
(45) Date of Patent: Dec. 26, 2006

(54) METHOD OF CONSTRAINTS CONTROL FOR OSCILLOSCOPE VERTICAL SUBSECTION AND DISPLAY PARAMETERS

(75) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 202 days.

(21) Appl. No.: 10/374,416

(22) Filed: Feb. 25, 2003

(65) Prior Publication Data

US 2004/0164984 A1     Aug. 26, 2004

(51) Int. Cl.
*G01R 13/00*     (2006.01)
(52) U.S. Cl. ..................................... 702/66
(58) Field of Classification Search .............. 702/66, 702/67, 68, 57
See application file for complete search history.

(56) References Cited

U.S. PATENT DOCUMENTS

| 4,578,640 | A | * | 3/1986 | Crooke et al. .............. 324/115 |
| 4,812,996 | A | * | 3/1989 | Stubbs ....................... 702/123 |
| 5,495,168 | A | * | 2/1996 | de Vries ................ 324/121 R |
| 5,517,105 | A | * | 5/1996 | Holzwarth .............. 324/121 R |
| 5,914,592 | A | * | 6/1999 | Saito ..................... 324/121 R |
| 6,278,268 | B1 | * | 8/2001 | Jaffe ...................... 324/121 R |
| 6,356,849 | B1 | * | 3/2002 | Jaffe ........................... 702/66 |
| 6,473,701 | B1 | * | 10/2002 | Tallman et al. ............... 702/67 |
| 6,947,043 | B1 | * | 9/2005 | Klingman et al. ....... 345/440.1 |
| 2003/0179242 | A1 | * | 9/2003 | Alexander et al. .......... 345/781 |

FOREIGN PATENT DOCUMENTS

EP     0 278 163     8/1988

* cited by examiner

*Primary Examiner*—Bryan Bui
*Assistant Examiner*—Demetrius R. Pretlow
(74) *Attorney, Agent, or Firm*—Moser, Patterson & Sheridan LLP; Thomas F. Lenihan

(57) ABSTRACT

An apparatus and method for constraining an amplitude range parameter associated with the acquisition and display of a signal under test (SUT) acquires samples of the SUT that are constrained according to the amplitude range parameter to generate a stream of acquired samples representing a constrained SUT. A controller generates a display signal suitable for use by a display device that includes constrained SUT waveform imagery visually cooperating with amplitude segment delineators. The controller adapts the number of amplitude segment delineators in response to the amplitude range parameter.

13 Claims, 5 Drawing Sheets

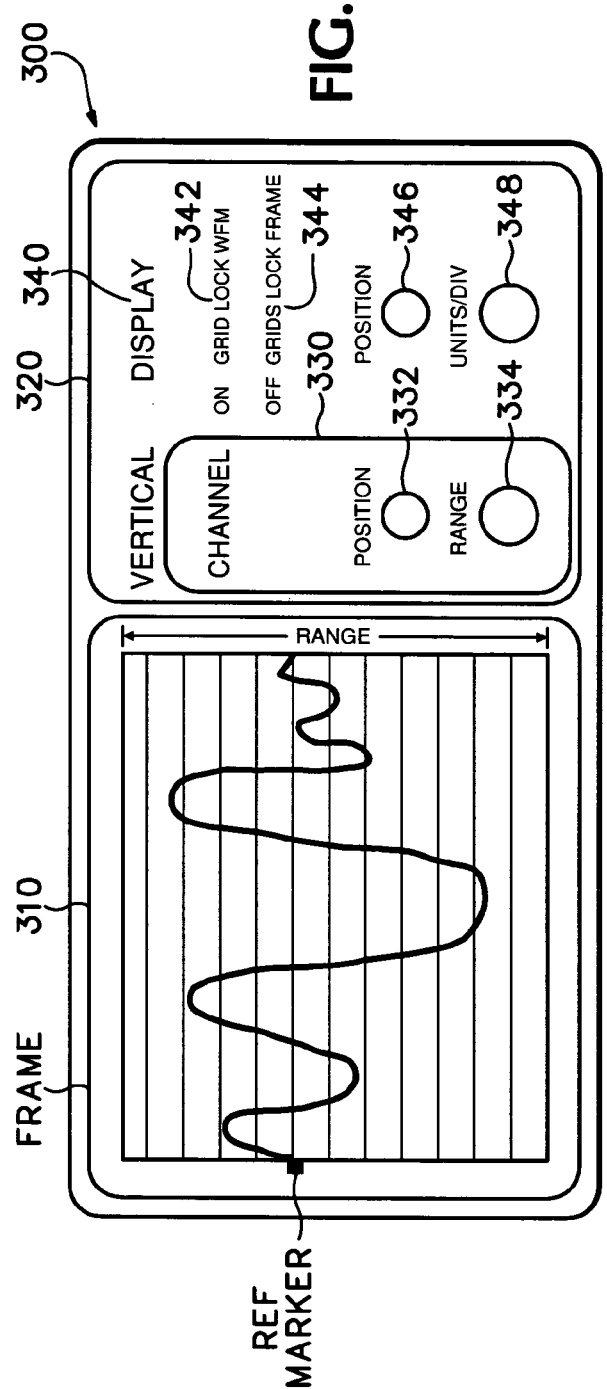
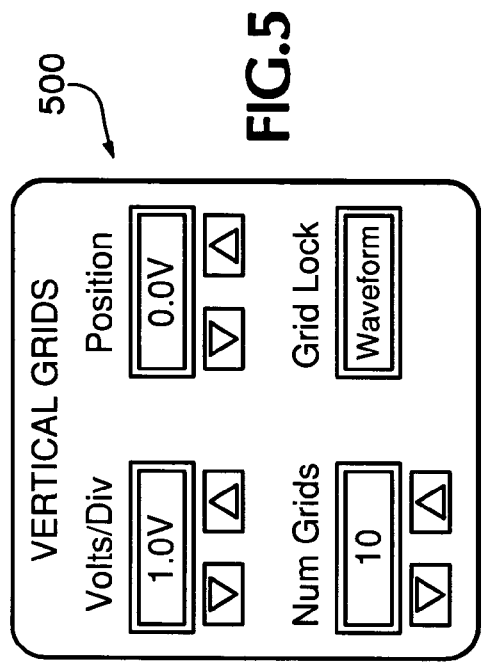
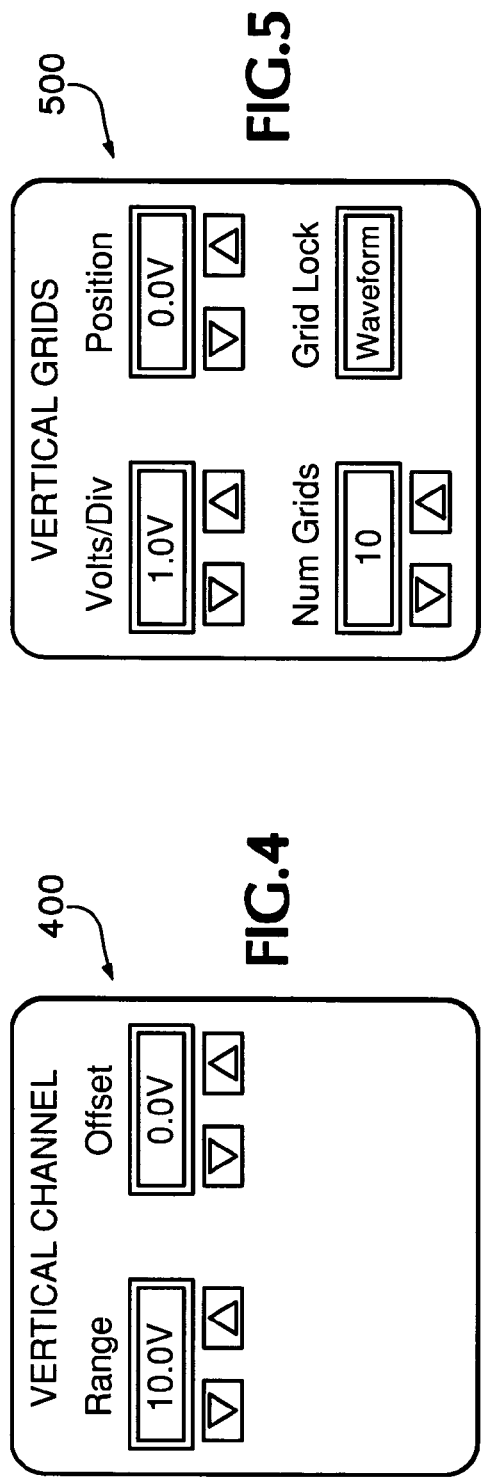

R=1.0V
V/D=0.1V

R=2.0V
V/D=0.1V

R=2.0V
V/D=0.2V

R=2.0V
V/D=0.4V
OFF=0.15V

R=1.0V
V/D=0.4V
OFF=0.15V

METHOD OF CONSTRAINTS CONTROL FOR OSCILLOSCOPE VERTICAL SUBSECTION AND DISPLAY PARAMETERS

CROSS REFERENCE TO RELATED APPLICATIONS

This patent application is related to simultaneously filed U.S. patent application Ser. No. 10/374,914 entitled METHOD OF CONSTRAINTS CONTROL FOR OSCILLOSCOPE-TIMEBASE SUBSECTION AND DISPLAY PARAMETERS, which is incorporated herein by reference in its entirety.

FIELD OF THE INVENTION

The invention relates generally to signal acquisition systems and, more particularly, to a method and apparatus for providing constraint control of vertical display parameters.

BACKGROUND OF THE INVENTION

Signal acquisition devices such as digital storage oscilloscopes (DSOs) use a display grid that is fixed at eight divisions vertically by ten divisions horizontally. The eight by ten division grid is the same size as the grids initially etched into the glass of the cathode ray tube (CRT) such as provided by the earlier analog oscilloscopes. The eight by ten division grid has lingered despite the fact that most engineering applications requiring the graphing of data are not limited to an eight by ten graticule. That is, in virtually all disciplines of science, data is typically graphed with scales that provide an appearance adapted for ease of interpreting the data. One disadvantage of the current standard oscilloscope approach is that as data is zoomed on the display, the graticules are still fixed as eight by ten rather than providing a constant frame of reference to the acquired waveform parameters.

SUMMARY OF INVENTION

These and other deficiencies of the prior art are addressed by the present invention of a method and apparatus for constraining vertical parameters such as Volts per division and resolution, such that data may be presented in a more useful manner (i.e., having an appropriate scale and/or graticule for ease of data interpretation).

An apparatus according to one embodiment of the invention comprises: a signal acquisition device, for constraining a signal under test (SUT) according to an amplitude range parameter and generating a stream of acquired samples representing a constrained SUT; and a controller, for generating a display signal suitable for use by a display device and including constrained SUT waveform imagery visually cooperating with amplitude segment delineators; the controller, in a first mode of operation, adapting a number of amplitude segment delineators in response to the amplitude range parameter.

BRIEF DESCRIPTION OF THE DRAWINGS

The teachings of the present invention can be readily understood by considering the following detailed description in conjunction with the accompanying drawings, in which:

FIGS. 3–5 depict user interface screens suitable for use in an embodiment of the present invention;

To facilitate understanding, identical reference numerals have been used, where possible, to designate identical elements that are common to the figures.

DETAILED DESCRIPTION OF THE INVENTION

The subject invention will be described within the context of a signal acquisition device such as a digital signal oscilloscope (DSO). However, it will be appreciated that the subject invention has applicability to other signal acquisition devices and, more particularly, those signal acquisition devices or display devices providing time-based display of acquired data or other information.

The invention enables the management amplitude parameters in conjunction with display parameters in a manner facilitating both control and ease of use. The invention as applied to, for example, a DSO enables more intuitive user interaction and simplified maintenance and design of the DSO.

The invention implements a Volts per division control system which operates differently in each of two modes. In a first mode, display grids are locked to the waveform. In a second mode, display grids are locked to the display frame.

Figure 1:
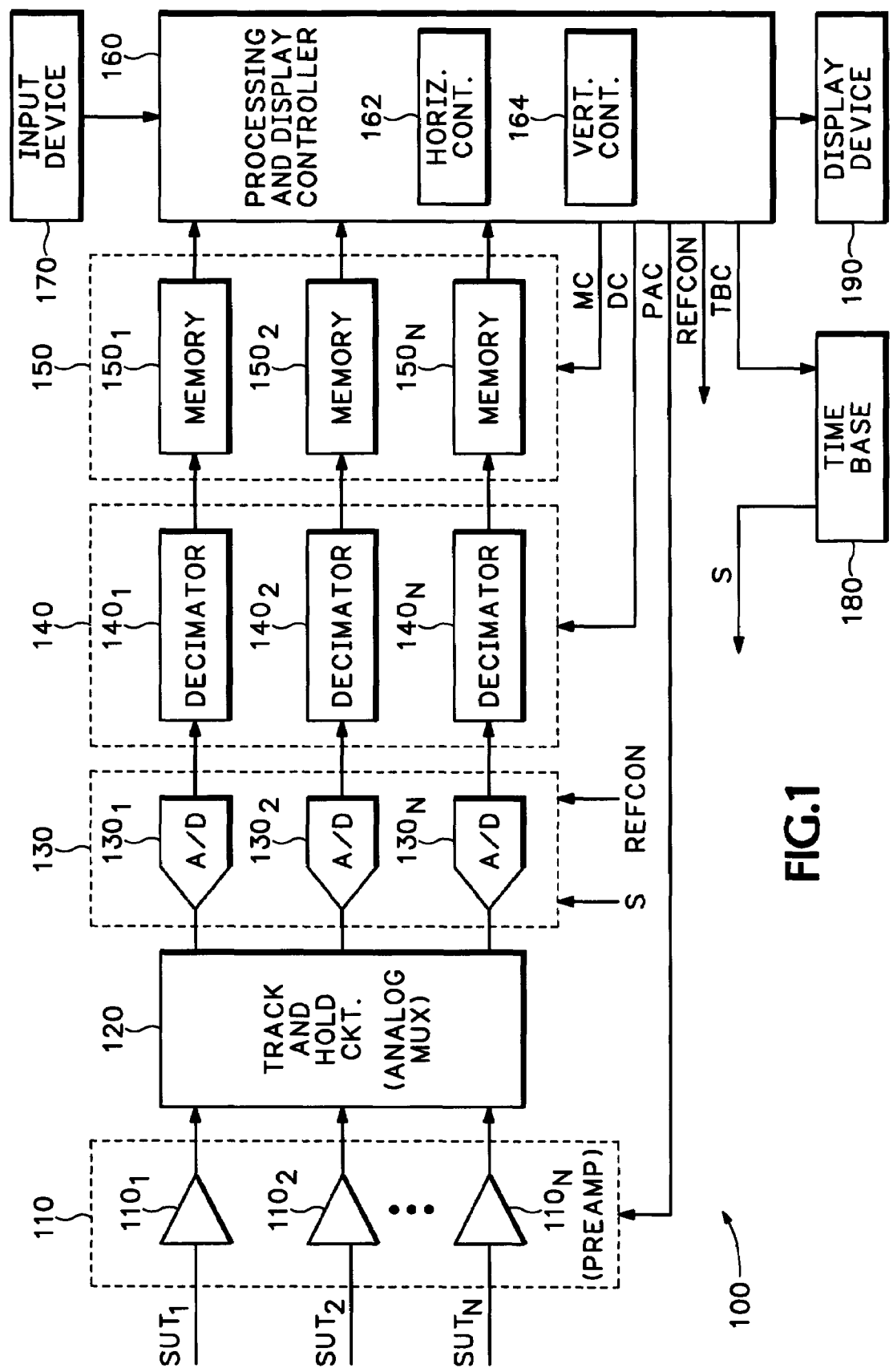
FIG. 1 depicts a high level block diagram of a signal acquisition system according to an embodiment of the present invention.

FIG. 1 depicts a high level block diagram of a signal acquisition system according to an embodiment of the present invention. Specifically, the system 100 of FIG. 1 receives a plurality of input signals under test (SUT) denoted as signals under test $SUT_1$–$SUT_N$ (collectively signals under test SUT).

The system 100 of FIG. 1 comprises a plurality of preliminary amplifiers $110_1$–$110_N$ (collectively preliminary amplifiers 110), a track and hold circuit 120, a plurality of analog-to-digital (A/D) converters $130_1$–$130_N$ (collectively A/D converters 130), a plurality of decimators $140_1$–$140_N$ (collectively decimators 140), a plurality of acquisition memories $150_1$ $150_N$ (collectively acquisition memory 150), a processing and display controller 160, an input device 170, a timebase 180 and a display device 190. It is noted that the system 100 of FIG. 1 implements N input channels, where N is an integer, though a single channel may also be implemented within the context of the present invention.

Each of N input channels receives a respective signal under test SUT, which SUT is then amplified by a respective preamp 110 and processed by the track and hold circuit 120. The track and hold circuit 120, illustratively an analog multiplexer, holds each SUT steady for a period of time sufficient to enable acquisition by a respective A/D converter 130.

The preamps 110 are responsive to a preamp control signal PAC provided by the processing and display controller 160 to perform any or all of an attenuation function, an amplification function, a range adjust function and a range offset function. In one mode of operation, the preamp control signal PAC causes the preamps 110 to amplify their respective signals under test to levels sufficient to utilize substantially all of the dynamic range of their corresponding A/D converters. In other modes of operation, such as discussed in more detail below with respect to the vertical control aspects of the present invention, the preamps 110 are caused to amplify their respective signals under test to normalize or otherwise conform subsequent acquired sample streams to a desired vertical parameter.

The A/D converters 130 receive and digitize their respective signals under test in response to a sample clock signal S produced by the timebase 180 to produce thereby respective sample streams. The sample clock signal S is preferably a clock signal adapted to cause the A/D converters 130 to operate at a maximum sampling rate, though other sampling rates may be selected. The timebase 180 is responsive to a timebase control signal TBC produced by the controller 160 to change frequency and/or pulse width parameters associated with the sample clock signal S. Optionally, the A/D converters 130 include a controllable Voltage reference source (not shown) that produces a Voltage reference used by the A/D converter 130 to establish the full scale Voltage range of the input signal range (i.e., the Voltage level of the signal provided by the preamp 110 causing a maximum digital output from the A/D converter). The controllable Voltage reference source is controlled by a signal REFCON produced by the processing and display controller 160. By decreasing the reference voltage level utilized by the A/D converter, the magnitude of the SUT producing the maximum magnitude output sample is reduced. Similarly, by increasing the reference voltage level utilized by the A/D converter, the magnitude of the SUT producing the maximum magnitude output sample is increased.

The sample streams produced by the A/D converters 130 are coupled to respective decimators 140. Each decimator 140 processes its received digitized signal under test according to a respective processing algorithm or decimation mode, such as a sub-sampling mode, a peak detection mode (e.g., min-max detection), a high resolution mode (e.g., a box-car averaging mode) or other mathematical function, algorithm or mode. The mode of operation of each decimator 140 may be preprogrammed such as with an application specific integrated circuit (ASIC) or field programmable gate array (FPGA), or may be programmed "on the fly" in response to a decimator control signal DC produced by the processing and display controller 160. The decimators 140 may utilize different respective functions, the same respective functions or a combination thereof.

The decimators 140 process respective received sample streams to produce respective decimated sample streams in response to respective received sample streams. For example, in response to receiving a digital sample stream from first A/D converter $130_1$, first decimator $140_1$ produces a corresponding decimated sample stream. The decimated sample streams produced by the decimators 140 are stored in corresponding portions of acquisition memory 150. The acquisition memory 150 may be a contiguous or non-contiguous memory and may, optionally, allocate respective portions to the respective decimators 140.

The processing and display controller 160 is used to manage the various operations of the signal acquisition system 100. The processing and display controller 160 performs various processing and analysis operations on the data samples stored within the acquisition memory 150. An embodiment of the processing and display controller 160 will be described in more detail below with respect to FIG. 2.

The processing and display controller 160 receives user commands via the input device 170, illustratively a keypad or pointing device. The processing and display controller 160 provides image-related data to the display device 190, illustratively a cathode ray tube (CRT), liquid crystal display (LCD) or other display device. The display device 190 may also comprises a touch screen device such that the display device 190 provides both user input and user output functionality. This touch screen embodiment is especially useful within the context of user interface functionality described in more detail below.

The processing and display controller 160 includes a horizontal control function 162 and a vertical control function 164. The horizontal control function 162 adapts and/or constrains horizontal display parameters (i.e., signal time parameters) of waveforms presented via the display device 190. The vertical control function 164 adapts and/or constrains vertical display parameters (i.e., signal amplitude parameters) of waveforms presented via the display device 190. The horizontal and vertical control functions will be discussed in more detail below with respect to FIGS. 2–6.

Within the context of the present invention, the various operations described herein may be conceptualized as producing a display signal suitable for use by a display device wherein imagery associated with multiple layers is provided. Specifically, a waveform layer may include waveform image data, a control layer may include control image data and a grid layer may include grid image data. In one embodiment of the invention, the control and grid layer information are combined within a single layer. In another embodiment, a single image layer is used to represent all information including waveform, control and grid information.

Figure 2:
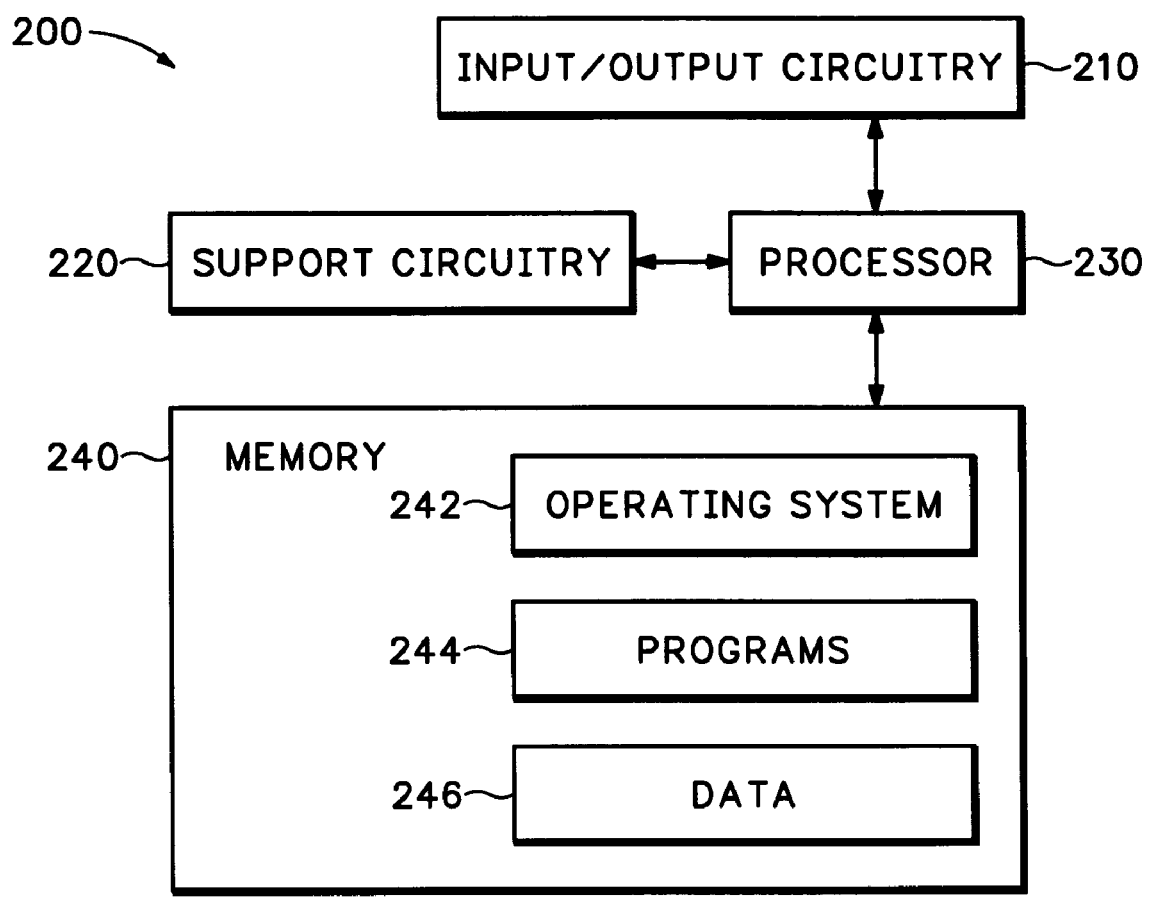
FIG. 2 depicts a high level block diagram of a processing and display controller suitable for use in the signal acquisition system of FIG. 1.

FIG. 2 depicts a high level block diagram of a controller suitable for use in the signal acquisition system 100 of FIG. 1. Specifically, the controller 200 of FIG. 2 may be employed to implement functions of the processing and display controller 160. The controller 200 may also be used to implement various functions within the system 100 of FIG. 1 in which software and/or firmware functionality is described.

The controller 200 of FIG. 2 comprises a processor 230 as well as memory 240 for storing various control programs and other programs 244 and data 246. The memory 240 may also store an operating system 242 supporting the programs 244, such as the Windows® operating system manufactured by Microsoft Corporation of Redmond, Wash. Other operating systems, frameworks and environments suitable for performing the tasks described herein will also be appreciated by those skilled in the art and informed by the teachings of the present invention. For example, the various operating systems utilized by Apple Computer Corporation of Cupertino, Calif. and the various Unix-derived operating systems may also be utilized within the context of the present invention.

The processing 230 cooperates with conventional support circuitry such as power supplies, clock circuits, cache memory and the like as well as circuits that assist in executing the software routines stored in the memory 240. As such, it is contemplated that some of the steps discussed herein as software processes may be implemented within hardware, for example as circuitry that cooperates with the processor 230 to perform various steps. The controller 200 also contains input/output (I/O) circuitry 210 that forms an interface between the various functional elements communicating with the controller 200. Although the controller 200 is depicted as a general purpose computer that is programmed to perform various control functions in accordance with the present invention, the invention can be implemented in hardware as, for example, an application specific integrated circuit (ASIC) or field programmable gate array (FPGA). As such, the process steps described herein are intended to be broadly interpreted as being equivalently performed by software, hardware or a combination thereof.

The programs 244 stored within the memory 240 may include programs adapted to implement the horizontal control function 162 and vertical control function 164 provided by the processing and display controller 160. The programs 244 may also include programs adapted to provide the various user interface functions, system control functions and display/image modification functions discussed herein.

The signal acquisition system 100 of FIG. 1 generally receives signals under test (SUT) which are digitized, decimated and subsequently processed to derive respective waveforms for display. The displayed waveforms have associated with them a horizontal parameter and vertical parameter. The horizontal parameter comprises a time parameter while the vertical parameter comprises an amplitude parameter. Control circuitry is responsive to user inputs to adjust the timebase (i.e., time per horizontal division) and amplitude (i.e., Volts per vertical division) of displayed waveform(s). That is, in an oscilloscope having a display device including a grid pattern, a user may select the number of Volts represented by each vertical segment and the amount of time represented by each horizontal segment.

Within the context of the present invention, a vertical channel range parameter is controlled via a user interface. The vertical channel range parameter specifies a usable Voltage range of a vertical amplifier and A/D converter within a particular channel. The vertical channel range parameter, when adjusted, changes input channel attenuation and/or gain settings of a vertical amplifier. For example, within the system 100 of FIG. 1, the preamplifier control signal (PAC) provided by the processing and display controller 160 may be used to adapt preamplifier gain settings to attenuate and/or increase a gain function imparted to a received signal under test. Unlike the known vertical scale control, the vertical channel range parameter is not coupled to a fixed display graticule. For example, vertical scale controls on current DSOs are typically provided in units of Volts per division, which assumes a fixed display grid. By contrast, where a variable or controllable display grid is provided in accordance with the present invention, the vertical range control is specified in units of Volts, amps, ohms or whatever unit is appropriate for the SUT and input probe providing the SUT. The vertical range is the maximum peak-to-peak signal that the vertical channel can pass without clipping. Volts per division in this case depends upon the number of display divisions distributed over the vertical range.

The vertical channel offset parameter controls where a zero reference is located within the specified vertical range. Thus, the vertical channel offset parameter controls the vertical position of an input waveform within the range of the A/D converter processing the corresponding SUT.

A display frame is a region on a display screen that bounds the region in which an acquired waveform will be displayed along with its graticules. The vertical range of an acquired signal is preferably displayed over the full vertical height of the display frame when a zoom mode of operation is not active. Derived waveforms such as mathematical functions or reference waveforms have their respective vertical scale and offset parameters specified with respect to the vertical frame and number of grids that are in use. The scale for a display readout is preferably specified as units per division. The vertical height of the display frame will be referred to herein as the vertical display range. Additionally, there may be any number of display frames in effect simultaneously on the display, which display frames may be of various sizes and proportions.

Derived waveforms such as mathematically derived waveforms based upon acquired signals under test are displayed within the frame according to user specified range and offset parameters. In this case, range does not mean a maximum clipping range; rather, in this case range means that a user has selected a vertical range of the mathematical function that will fit within the vertical range of the display frame.

A display parameter "vertical units per division" within the present invention results in the vertical gain remaining constant while the distance between vertical grids and the number of grids that cover a vertical frame changes. That is, the vertical grids which are delineated by horizontal lines increase or decrease in relative distance to each other in response to the vertical units per division control. A user may change the vertical gain of an input channel using the vertical range control while maintaining a constant Voltage per division on the display device. There are several ways to control the vertical units per division; namely: (1) choose the vertical units per division from a conventional list of 1-2-5 sequences of "nice" values; (2) allow any arbitrary value to be assigned via the input device; and (3) allow the user to specify how many vertical grid lines will be caused to fit within the vertical range of the display frame. For the first two methods, the grids are preferably locked to constant reference points with respect to the display waveform. For the third method, the grids are preferably locked with respect to the frame to provide operation similar to that of a conventional oscilloscope display.

The present invention allows for the display of multiple waveforms having different scales within one frame. In one embodiment, multiple waveforms having different scales are plotted in the same display frame along with respective different display grids. When a waveform is selected, the grids for that waveform are also displayed, which is somewhat analogous to the current DSO behavior wherein graticule scale readout numbers are for a currently displayed waveform.

A vertical grid offset parameter specifies the position of vertical grid lines with respect to the waveform vertical reference marker. Thus, the vertical grid offset causes the display grids to move vertically while the waveform and a frame remain fixed in a position on the display. The vertical grid offset parameter is not appropriate for the third mode of operation discussed above wherein grids are fixed with respect to the frame.

FIG. 3 depicts a user interface suitable for use in an embodiment of the present invention. The user interface 300 of FIG. 3 is suitable for display on, for example, a touch screen display device such as discussed above with respect to FIG. 1. That is, the objects displayed within the context of the user interface (and its submenus) are optionally responsive to direct user manipulation to provide the various functionality described herein.

The user interface 300 of FIG. 3 comprises a waveform display region 310 and a control region 320. The waveform display region 310 displays one or more waveforms for a peak-to-peak amplitude or range that is controlled by the user. The waveform display region 310 is depicted as comprising a plurality of horizontal lines delineating discrete portions of the vertical display range. A Volts (or other unit) per division parameter is represented by the portion of range between adjacent horizontal lines. Also shown in the waveform display region 310 is a reference marker which indicates the point within the displayable range at which an initial vertical grid delineator is located. While not shown, vertical lines delineating a time per division parameter are normally displayed with the horizontal lines to form thereby a display grid. The acquired waveforms are nominally fit to the width of the waveform display region 310. The acquired waveforms are displayed with a duration parameter and range parameter adapted to fit, respectively, the width and height of the display frame when a zoom mode is off.

The control region 320 comprises a horizontal signal acquisition control region 330 and a display control region 340. The display control region 340 comprises a grid lock to waveform (GRID LOCK WFM) control 342, a grid lock to frame control 344, a position control 346 and a units per division control 348. The grid lock to waveform control 342, when enabled, places the signal acquisition device in a first mode of operation wherein the grid lines delineating the Volts per division parameter are locked to waveform such that an increase in the range parameter results in an increase in the number of such grid lines. The grid lock to frame control 344, when enabled, places the signal acquisition device in a second mode of operation wherein the horizontal grid lines delineating the Volts per division parameter are locked to the display frame such that increases in the range parameter do not result in an increase in such grid lines. The position control 346 enables adjustments in Voltage or offsets of the displayed waveform. Such Voltage offsets are especially useful in aligning portions of interest of a displayed waveform to grid lines to assist a user in analyzing the waveform. The units per division control 348 is used to adjust the displayed Volts per division parameter.

The vertical signal control region 330 includes a position control 332 and a range control 334. The position control 332 is used to control a vertical grid offset parameter to increase or decrease the vertical offset of the displayed waveform from a nominal position. The actual position of the initial portion of the displayed waveform within the display frame is indicated by the reference marker within the waveform display region 310. The range control 334 determines the vertical range of the signals under test processed to generate the displayed waveform. The vertical range control 334 may cause amplification or attenuation of the signal under test via the preamplifier 110, amplification or attenuation of the signal under test by changing the reference Voltages used by the A/D converters 130 and/or amplification or attenuation of the signals under test using the processing capabilities within the decimators 140.

In a first mode of operation, the grid lines are locked to the waveform. In this mode of operation, adjusting a "Volts per division" parameter results in the number of grids that cover an acquired waveform range to be variable. The In the first mode of operation, the grid lines are locked to the waveform. In this mode of operation, adjusting a "Volts per division" parameter results in the number of grids that cover an acquired waveform range to be variable. The grids locked to the waveform mode of operation is invoked by a user selecting the "on" position of the grid lock WFM control 342. An advantage of using this control is that constraints on the range parameter imposed by requirements for specific values of Volts per division on the screen are relieved. Thus, the user may now change the vertical range while maintaining a constant Volts per division on the display, which was not possible with previous oscilloscope range and display constraint controls. In this manner, better control of the range parameter is provided in order to bring more signal range on screen while the number of grids increases as the time per grid is kept constant.

Preferably, the reference grid is drawn at the reference marker position when a "grid offset" or position control is set to zero. All other vertical grids delineated by horizontal lines are spaced with respect to this reference grid position. Adjusting the position control moves the grids with respect to the reference marker position. When a display zoom function is used, the grids scale along with the waveform and maintain their same relationship with respect to the waveform. Volts per division is then specified in exact 1-2-5 sequences when incrementing with a knob such as units per division control 348. However, it will be appreciated that the user may also enter Volts per division information through other devices such as a keypad or pointing device.

In the second mode of operation, the grids are locked to the display frame. In this mode of operation, adjusting a "Volts per division" parameter does not change the number of grids that cover an acquired waveform range. This mode of operation is invoked by, for example, a user selecting the "on" position for the grid lock frame control 344. This mode allows the user to have a view of the waveform similar to current oscilloscopes but with some additional capability. Specifically, in this second mode of operation, the vertical grid lines drawn horizontally are fixed with respect to the display frame. The difference is that the user is not limited to always having eight or ten divisions as with current oscilloscopes; rather, users may choose any number of grid lines and/or the Volts per division between grid lines. It is noted that adjusting the Volts per division parameter will not change the acquisition parameters. The Volts per division parameter is a display grid control, not an acquisition parameter control. Only the range control will result in a change to acquisition parameters.

There are several techniques contemplated by the inventor for specifying the Volts per division (which determines the number of displayed vertical grids). In a first technique, the number of horizontal grid lines to be drawn is specified directly by the user. This first technique in conjunction with the range selection determines the Volts per division readout. When fixing the number of grid lines using this first technique, the Volts per division values are used to divide the range. That is, the conventional 1-2-5 values common on oscilloscopes will not necessarily be the Volts per division values selected using this technique. In a second technique, the number of grids is specified by entering a specific time per division number. In this manner, very "nice" or conventional time per division grid values are attained. These grid values may comprise the conventional 1-2-5 values, or may comprise any other values desired by a user. Given this method of entry, the number of grids fixed to a frame is determined by the current range and the requested Volts per division.

FIG. 4 depicts an exemplary user interface organization of range controls. The vertical channel submenu 400 of FIG. 4 may be invoked by selecting one of the controls within the vertical signal control region 330 of the user interface 300 of FIG. 3. The vertical channel submenu 400 of FIG. 4 may also be selected directly or accessed via a remote computing device. Specifically, the vertical channel control interface 400 of FIG. 4 enables user selection of range and offset parameters.

A selected range display object displays a currently selected range (illustratively 10.0 Volts). Increment and decrement objects proximate the range display object may be used to increment or decrement the selected range. As previously noted, incrementing or decrementing the selected range comprises amplifying or attenuating a received SUT or modifying the reference Voltage of the corresponding A/D converter.

A selected offset display object displays a currently selected offset (illustratively 0.0 Volts). Increment and decrement objects proximate the offset display object may be used to increment or decrement the offset.

FIG. 5 depicts an exemplary user interface organization of vertical grid controls. Specifically, the vertical grid control interface 500 of FIG. 5 enables user selection of Volts per division, grid position, number of grids and grid lock mode.

A selected position or offset display object displays the grid position (illustratively 0.0 Volts) as offset from a reference position (illustratively a first or origin grid delineation, center of frame position or edge of frame position). Increment and decrement objects proximate the position display object may be used to increase or decrease the Voltage offset of the grid from the reference position.

A selected Volts per division display object displays a currently selected Volts per division (illustratively 1.0 Volts). Increment and decrement objects proximate the Volts per division display object may be used to increment or decrement the selected Volts per division associated with each vertical division.

A selected number of grids display object is used to display the presently selected number of grids (illustratively 10). Increment and decrement objects proximate the grid number display object may be used to increment or decrement the selected number of grids.

A grid lock mode indicator object is used to display the presently selected grid lock mode (illustratively WAVEFORM). As previously noted, the grid may be locked to a waveform (via control 342) or locked to a frame (via control 344). The grid may also remain unlocked.

Figure 6:
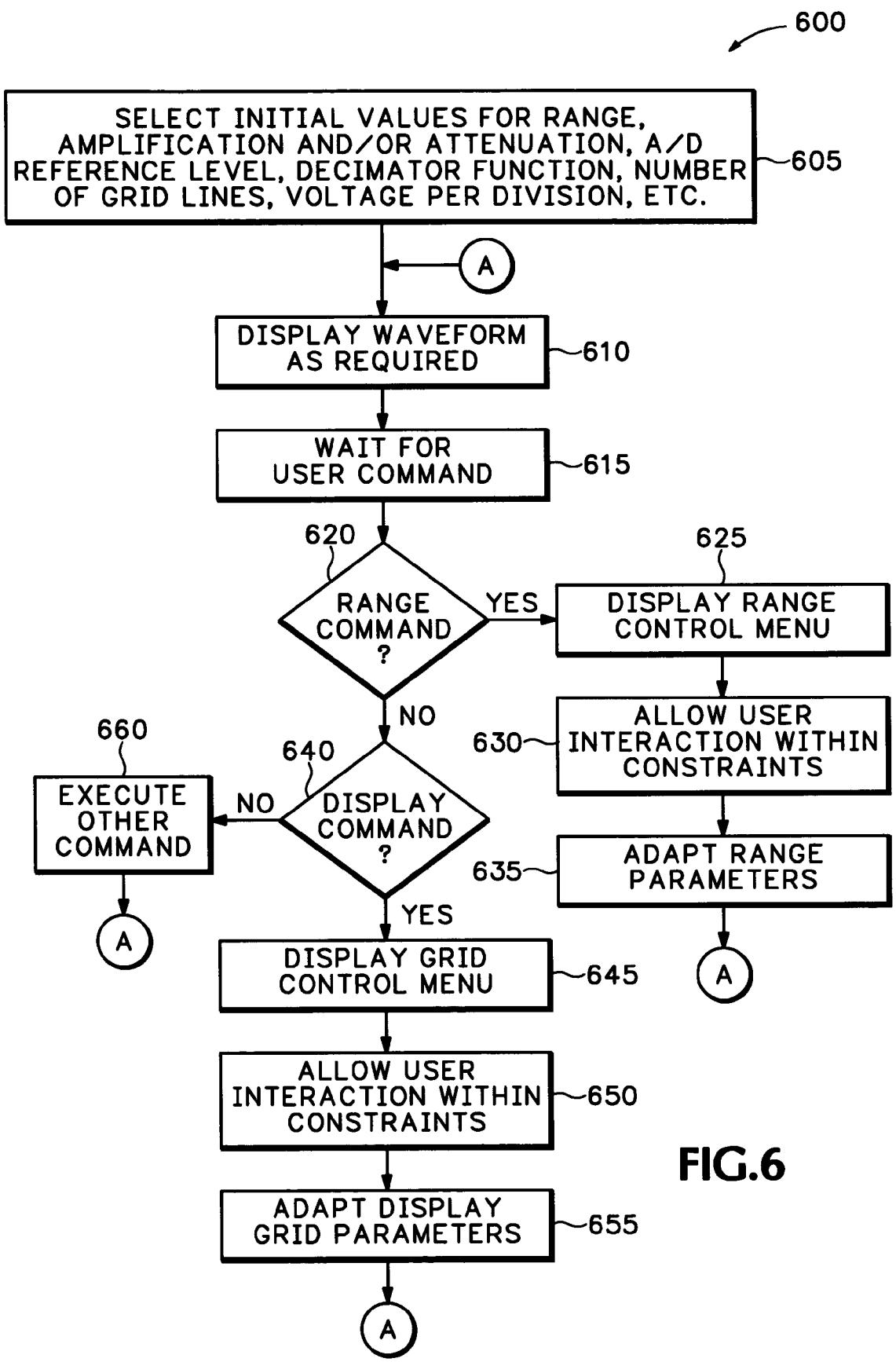
FIG. 6 depicts a flow diagram of a method according to an embodiment of the invention.

FIG. 6 depicts a flow diagram of a method according to an embodiment of the invention. The method 600 of FIG. 6 is suitable for use in the signal acquisition system 100 of FIG. 1 to provide to a user control functionality in accordance with the present invention. Specifically, the method 600 of FIG. 6 is entered at step 605 where initial values for range, amplification and/or attenuation, A/D reference level, decimator function, number of grid lines, Voltage per division and the like are selected. Step 605 may be implemented as, for example, a portion of an automatic triggering or setup routine adapted for initially acquiring a signal under test. Step 605 may also be implemented by selecting default values or utilizing the most recent values.

At step 610, the waveform as acquired is displayed. That is, at step 610 the waveform(s) associated with one or more acquired signals under test are displayed utilizing range parameters and grid display parameters initially selected at step 605 or subsequently modified as discussed below with respect to steps 615–660.

At step 615, the method waits for a user command. Upon receiving a user command, at step 620 a determination is made as to whether the received user command comprises a range command. If the command is not a range command, then at step 640 the method determines whether the user command comprises a display command. If the user command is not a timebase command or display command, then at step 660 the method executes some other command (e.g., screen intensity, system setup, system configuration and the like) and returns to step 610.

In the case of a range command, at step 625 a range control menu is displayed. That is, at step 625 a user interface such as the range control menu discussed above with respect to FIG. 4 is displayed for user interaction. At step 630, the method allows user interaction with the range control menu within the various constraints discussed above. Upon the conclusion of user interaction at step 630, the method at step 635 adapts the various range parameters of the acquisition system 100 to those at step 630. The method then returns to step 610 to display the waveform(s) as acquired according to the new range parameters.

In the case of a display command, at step 645 a user interface such as the display control menu discussed above with respect to FIG. 5 is displayed for user interaction. At step 650, the method allows user interaction with the display control menu within the various constraints discussed above. Upon conclusion of the user interaction at step 650, the method at step 655 adapts the various display parameters of the acquisition system 100 to those selected at step 650. The method then returns to step 610 to display the waveform(s) as acquired according to the new display parameters.

The following examples demonstrate how control of the various parameters affects the waveform, frame and grid display. These are cases where the grids are fixed with respect to the horizontal trigger position and are independent of the display frame (i.e., the grids are locked to the waveform).

In a grid lock to frame mode of operation, the vertical grid lines are fixed in position with respect to the display frame. A user may specify the number of grids to be drawn within the frame. Therefore, the distance from the top to bottom of the frame is determined by the vertical range control, which control adjusts the channel gain as previously discussed. The Voltage per division of the display is then determined by the number of grids specified to be within the frame. If the user specifies eight grid lines, then the display in this mode of operation will look similar to that of a standard oscilloscope. The user may adjust the units per division control to specify an exact 1-2-5 sequence of choices. The user may also specify any arbitrary units per division. Adjusting units per division will not change the gain of the vertical channel; rather, such adjustment only affects the grids within the display frame.

In a grid lock to waveform mode of operation, the vertical display grids are locked with respect to the waveform and not to the display frame. The reference grid line is drawn horizontally at the position of the waveform ground reference marker. Remaining grids are drawn with a spacing from the reference grid marker that is determined by the grid scale (i.e., the units per division such as Volts per division, amps per division, ohms per division and the like). The grid lock to waveform mode of operation will be visually depicted below with respect to FIGS. 7A–7E.

Figure 7A:
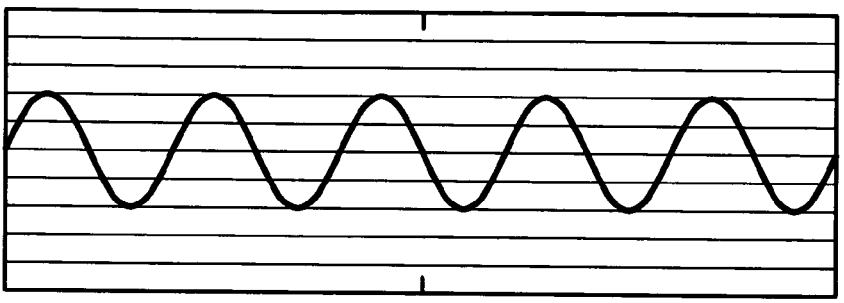
FIGS. 7A–7E depict graphical representations of waveforms useful in understanding the present invention.

FIG. 7A depicts an exemplary display of a sine wave function displayed at a range (R) of 1.0 Volts and a Voltage per division V/d of 0.1 Volts per division. It can be seen that the 1.0 Voltage range is divided into ten 0.1 Volt divisions.

Figure 7B:
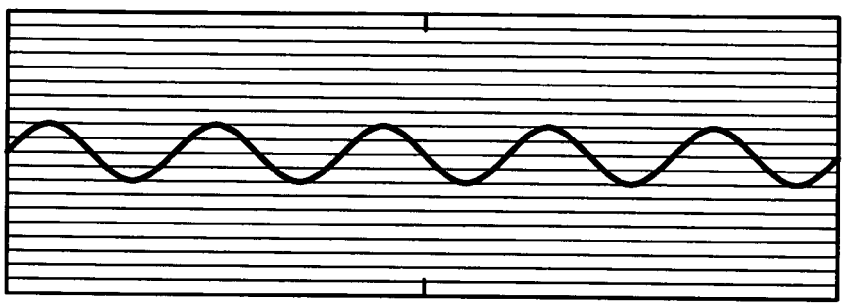

FIG. 7B depicts the sine wave function display of FIG. 7A after user adjustment of the vertical range control to select a setting of 2.0 Volts. That is, FIG. 7B depicts the sine wave function of FIG. 7A displayed at a range (R) of 2.0 Volts and a Volts per division V/d of 0.1 Volts per division. It can be seen that the 2 Volt vertical range is divided into twenty 0.1 Volt segments.

Figure 7C:
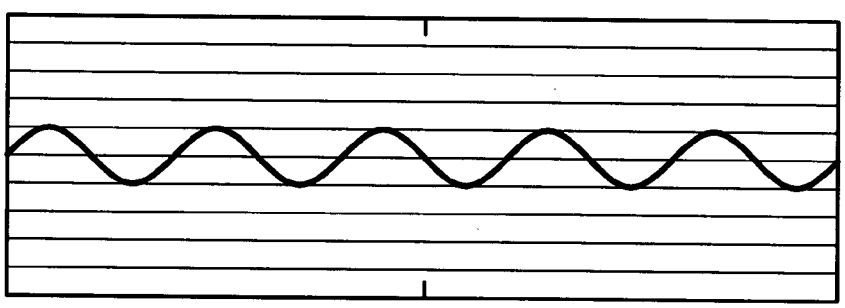

FIG. 7C depicts an exemplary display of the sine wave function of FIG. 7A that is displayed at a range (R) of 2.0 Volts and a Volts per division (t/d) of 0.2 Volts per division. The display of FIG. 7C is the result of user manipulation during the display of FIG. 7B in which the vertical range was left set to 2.0 Volts, but the Volts per division parameter was set to 0.2 Volts per division, thereby reducing the number of delineated grids by a factor of 2. It should be noted that the sine wave presented in each of the display diagrams of FIGS. 7A–7C begins at a location of 0 Volts (i.e., the reference grid is located at the center of the range).

Figure 7D:
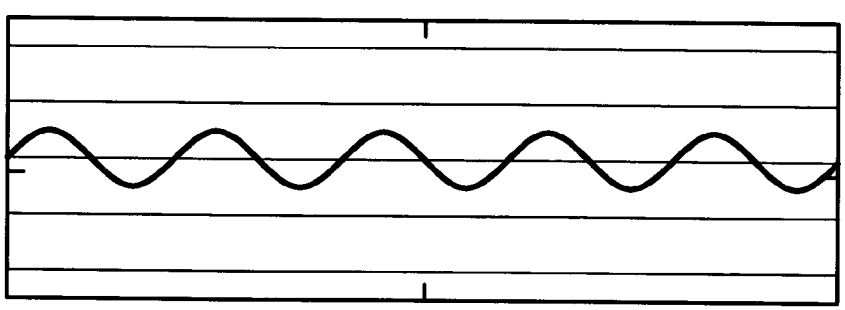

FIG. 7D depicts an exemplary display of the sine wave function of FIG. 7A that is displayed at a range (R) of 2.0 Volts, a Volts per division (V/d) of 0.4 Volts per division, and a vertical offset (OFF) of 0.15 Volts. It will be noted that the peak-to-peak height of the waveform does not change between FIGS. 7C and 7D, though the number of grids is reduced by half (due to doubling of the Voltage per division) and the entire waveform and grids are offset in the frame by 0.15 Volts due to user adjustment of the vertical offset parameter.

Figure 7E:
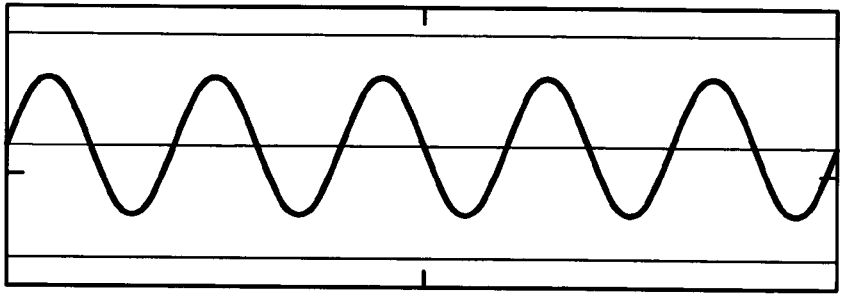

FIG. 7E depicts an exemplary display of the sine wave function of FIG. 7A that is displayed at a range (R) of 1.0 Volts, a Volts per division (V/d) of 0.4 Volts per division and an offset (OFF) of 0.15 Volts. It will be noted that the waveform displayed at FIG. 7E has a peak-to-peak size double that of the waveform displayed in FIG. 7D due to changing the vertical range from 2.0 Volts to 1.0 Volts. Moreover, since the Volts per division control was left constant, there are less grids displayed on the display frame. Finally, since the vertical offset is still at 0.15 Volts, the waveform reference marker and zero grid line move with respect to the frame.

The above-described invention advantageously provides a means to unify the control of primary vertical acquisition parameters such as amplifier gain or attenuation, A/D converter reference value and decimator function in terms of higher level user interface parameters of range and offset, as well as in terms of the display parameters of units per division or number of grids. When the grids are locked to the waveform, they will scale with the waveform when a zoom function is in use. The invention operates to relieve design constraints on oscilloscope or other signal acquisition device designers to allow a much larger choice of possible input channel ranges within the oscilloscope or signal acquisition system vertical control circuitry while still allowing for a relatively straight forward implementation of the improved vertical control and display model represented by the range and offset controls discussed herein.

The invention provides to a user a new and more meaningful gain control unit for acquisition channels that is decoupled from the display parameters. Specifically, the gain is specified in terms of a new parameter denoted as the vertical range that represents the peak-to-peak Voltage that an input channel can provide at its output into acquisition memory. The specification of gain is no longer ambiguous as it is within current oscilloscopes within the marketplace (e.g., with current DSOs it is necessary to know that the vertical channel range is fixed over some specified number of divisions when zoom is off to determine what the range is). Moreover, when zoom mode is active in current oscilloscopes, the zoom scale factor must be included to calculate the range. By contrast, in the present invention the range may be directly specified via the user interface control and is denoted as vertical range, which reads out in the menu directly.

In addition, the invention provides increased flexibility in the manner in which vertical grids are controlled on the display. The user may specify any number of vertical grids that are fixed with respect to the frame, not just eight as is now the current practice. In addition, the new model allows for the novel approach of letting a user specify Volts per division for grids that are fixed in position with respect to a waveform's reference marker. This provides increased utility for the user such as the ability to specify that grids are spaced at a level of steps that an output of a D/A converter is intended to operate. The new grid with respect to these steps will indicate visually the linearity and evenness of the D/A converter steps.

While the foregoing is directed to the preferred embodiment of the present invention, other and further embodiments of the invention may be devised without departing from the basic scope thereof, and the scope thereof is determined by the claims that follow.

What is claimed is:

1. Apparatus, comprising:
a signal acquisition device, for constraining a signal under test (SUT) according to an amplitude range parameter and generating therefrom a stream of acquired samples; and
a controller, for generating a display signal suitable for use by a display device and including constrained SUT waveform imagery visually cooperating with amplitude segment delineators;
said controller, in a first mode of operation, adapting a number of amplitude segment delineators in response to said amplitude range parameter.

2. The apparatus of claim 1, wherein:
in response to user input indicative of a new amplitude range parameter, said controller in said first mode of operation adjusts amplitude constraints imparted to said SUT.

3. The apparatus of claim 1, wherein said signal acquisition device comprises:
an amplifier, for controllably amplifying said SUT to produce an amplified SUT; and
an analog to digital (A/D) converter, for sampling said amplified SUT to form thereby said stream of acquired samples.

4. The apparatus of claim 2, wherein:
said amplitude range parameter being adjusted by imparting at least one of an amplification function and an attenuation function to said SUT.

5. The apparatus of claim 2, wherein said signal acquisition device comprises:
an amplifier, for controllably imparting said amplification and attenuation function to said SUT to produce an amplified SUT; and
an analog to digital (A/D) converter, for sampling said amplified SUT to form thereby said stream of acquired samples.

6. The apparatus of claim 5, wherein:
said amplitude range parameter being adjusted by adjusting a level of a reference signal applied to said A/D converter.

7. The apparatus of claim 1, wherein:
said controller, in said first mode of operation, operates to lock an initial portion of said waveform imagery to an initial amplitude segment delineator.

8. The apparatus of claim 7, wherein:
in response to user input indicative of a new amplitude range parameter, said controller adjusts the amplitude constraints imparted to said SUT and scales the number of amplitude segment delineators according to the ratio of the new and existing amplitude range parameters.

9. The apparatus of claim 1, wherein:
in response to user input indicative of a desired number of amplitude segment delineators, said controller segments said waveform imagery into said desired number of amplitude segments.

10. The apparatus of claim 1, wherein:

said controller, in a second mode of operation, adapting a number of amplitude segment delineators in response to user input indicative of a desired number of amplitude segment delineators.

11. An oscilloscope, comprising:

signal acquisition circuitry for acquiring a plurality of samples of at least one signal under test (SUT) in response to at least one range control signal;

signal display circuitry for displaying at least a portion of said acquired samples and a corresponding display grid; and a controller, for modifying said at least one range control in response to a first user command, and for modifying said display grid in response to a second user command; wherein:

said display grid modification comprises at least one of modifying a number of amplitude grid lines and selecting a units per amplitude grid line.

12. The oscilloscope of claim 11, wherein said range control modification causes an amplitude constraint of said SUT.

13. The apparatus of claim 7, wherein said signal acquisition device comprises:

an amplifier, for controllably amplifying said SUT to produce an amplified SUT; and an analog to digital (A/D) converter, for sampling said amplified SUT to form thereby said stream of acquired samples.

* * * * *